(12) United States Patent
Bloch et al.

(10) Patent No.: US 7,652,907 B2
(45) Date of Patent: Jan. 26, 2010

(54) ELECTROCHEMICAL MEMORY DEVICE

(75) Inventors: Didier Bloch, Biviers (FR); Frederic Le Cras, Notre-Dame-de-l'Osier (FR)

(73) Assignee: Commissariat A l'Energie Atomique, Paris (FR)

( * ) Notice: Subject to any disclaimer, the term of this patent is extended or adjusted under 35 U.S.C. 154(b) by 190 days.

(21) Appl. No.: 11/842,250

(22) Filed: Aug. 21, 2007

(65) Prior Publication Data
US 2008/0043515 A1 Feb. 21, 2008

(30) Foreign Application Priority Data
Aug. 21, 2006 (FR) .................... 06 53411

(51) Int. Cl.
*G11C 13/02* (2006.01)
*H01M 4/00* (2006.01)
*H01M 8/10* (2006.01)

(52) U.S. Cl. .............. 365/107; 429/29; 429/30
(58) Field of Classification Search ........ 365/106, 365/107; 429/29, 30
See application file for complete search history.

(56) References Cited

U.S. PATENT DOCUMENTS

| 5,601,952 | A  | 2/1997 | Dasgupta et al. |
| 5,761,115 | A  | 6/1998 | Kozicki et al. |
| 6,355,376 | B1 | 3/2002 | Meunier |
| 6,864,522 | B2 | 3/2005 | Krieger et al. |
| 6,865,117 | B2 * | 3/2005 | Kozicki .......... 365/189.09 |
| 7,227,169 | B2 * | 6/2007 | Kozicki .......... 257/2 |
| 2006/0076549 | A1 | 4/2006 | Ufert |
| 2009/0029237 | A1 * | 1/2009 | Yazami .......... 429/50 |

FOREIGN PATENT DOCUMENTS

| DE | 10 2004 046 392 | 4/2006 |
| EP | 0 380 058 | 8/1990 |
| EP | 1 571 673 | 9/2005 |
| EP | 1 657 760 | 5/2006 |
| FR | 2 873 856 | 2/2006 |
| WO | 98/48467 | 10/1998 |

OTHER PUBLICATIONS

French Search Report Dated Apr. 2, 2007.

* cited by examiner

*Primary Examiner*—Ly D Pham
(74) *Attorney, Agent, or Firm*—Pearne & Gordon LLP

(57) ABSTRACT

A memory device including a stack of layers. At least one first active layer is based on a crystalline ionic and electronic conducting material capable of releasing and/or accepting at least one ionic species. At least one second active layer is based on a crystalline ionic and electronic conducting material capable of releasing and/or accepting the ionic species. The first active layer and the second active layer are based on a material that has a high potential variation for a low variation in the concentration of the ionic species. At least one layer forms an electrolyte between the first active layer and the second active layer, and is based on at least one ionic conducting and electronic insulating material. A measurement instrument is provided for measuring the electrochemical potential difference between the first active layer and the second active layer.

12 Claims, 1 Drawing Sheet

ELECTROCHEMICAL MEMORY DEVICE

TECHNICAL DOMAIN

This invention relates to the domain of memories and concerns a new memory technology called NEMOs (Nano Electrochemical MemOries) in the remainder of this document. This invention describes the manufacturing of an electrochemical electronic memory cell formed by a stack of thin layers comprising at least one first active layer capable of reversibly releasing and/or accepting at least one ionic species, at least one second active layer capable of reversibly releasing and/or accepting said ionic species, a solid electrolyte between the first active layer and the second active layer. Current pulse generating means are provided to modify the state of the cell and for measuring the electrochemical potential difference between the first active layer and the second active layer so as to determine the state of the cell.

The invention may be integrated particularly into a large number of electronic and data processing devices, communication terminals, apparatuses and equipment.

PRIOR ART

A memory cell structure called a PMC (Programmable Metallisation Cell) formed from a solid electrolyte located between two electrodes is disclosed in document U.S. Pat. No. 5,761,115.

The operation of PMC memory cells is based on the formation of metallic elements called "dendrites" within the solid electrolyte between two electrodes, when these electrodes are raised to appropriate potentials. The formation of dendrites provides a means of obtaining a given electrical conduction between two electrodes as soon as a dendritic conducting bridge is set up between the two electrodes. The potentials applied to each of the electrodes can be modified to modify the distribution and number of dendritic conducting bridges set up, and thus to modify electrical conduction between the two electrodes. For example by inverting the potential between the electrodes, it is possible to break the contact set up by the dendritic conducting bridges between the electrodes by partial dissolution of these bridges, and therefore to eliminate electrical conduction, or at least to considerably reduce it.

The PMC cells can thus operate in two states: firstly a so-called "ON" state and secondly a so-called "OFF" state, and they can act as memory cells. In PMC memory cells, the solid electrolyte may be based on a chalcogenide such as GeSe conducting silver ions. This electrolyte is an ionic conductor and electronic insulator, and is usually placed between a silver-based electrode and an inert electrode, for example based on Nickel. No contact is set up in the initial state between the two electrodes, that are separated by an insulator. When a bias voltage is applied between the two electrodes, the silver electrode produces $Ag^+$ ions that pass through the electrolyte and are deposited on the opposite electrode, forming one or several metallic silver dendrites. When one or several dendrites pass through the entire thickness of the electrolyte and come into contact with the silver electrode facing them, a conducting bridge is set up and the memory changes to the conducting state. A PMC memory cell can pass very quickly from the conducting state to the insulating state. These two states correspond to memory "write" and "erase" actions.

However PMC memories have several disadvantages. After a certain number of write/erase cycles, there are silver-based dendrites present on the two electrodes facing each other simultaneously. A symmetric silver electrode/electrolyte/silver electrode system can be formed. Regardless of the sign of the imposed voltage (positive or negative), there is then a serious risk of creating a path of conducting dendrites between the two electrodes, which is contrary to the required objective. On the other hand, maintaining the erase voltage that should create a break in the dendrite formed on one of the two electrodes, will actually cause formation of a dendrite (on the electrode opposite the first electrode) that will once again short circuit the two electrodes.

Furthermore, the growth of silver dendrites does not take place in a controlled manner. At the end of a certain number of erase/write cycles, the electrolytic medium between the two electrodes is saturated with isolated metallic aggregates, and it becomes impossible to control operation of the system: conducting bridges are set up and dissolved at random during write and erase steps, and the reliability of the device is reduced.

An other type of architecture was proposed, for example in the U.S. Pat. No. 6,864,522. This document presents a memory device including two collecting electrodes and a stack of layers including at least one active layer which electrical conductivity varies by applying a potential difference between the two electrodes.

The problem arises of finding a new electrochemical memory cell device that does not have the disadvantages mentioned above, and more sensitive than the electrochemical memories based on the variation of conductivity of the electrodes.

PRESENTATION OF THE INVENTION

The invention relates to a memory device comprising a stack of layers including:
- at least one first active layer based on a crystalline ionic and electronic conducting material capable of releasing and/or accepting at least one ionic species;
- at least one second active layer based on a crystalline ionic and electronic conducting material capable of releasing and/or accepting said ionic species;
- at least one layer forming an electrolyte between the first active layer and the second active layer, and based on at least one ionic conducting and electronic insulating material,
- means of measuring the electrochemical potential difference between said first layer and said second layer.

The first active layer and the second active layer are based on a material that have a high potential variation for a low variation in the concentration of said ionic species around a given particular composition of the material.

The first active layer and the second active layer are based on a material that have a potential variation higher than or equal to 0.3 volts or to 0.5 volts for a variation in the concentration of said ionic species of less than 5% or 10% around a given particular composition of the material.

The invention uses a measurement of the electrochemical potential variation(s) of materials in active layers under the effect of a small variation in their corresponding compositions.

A device according to the invention implements a measurement of electrochemical potential difference more significant than a system following the previous art which is based on variations of electrical conductivity of the electrode.

The memory device according to the invention may also comprise means of generating current capable of injecting current into said stack in the form of current pulses.

This device may also be subjected to large potential variations at its terminals, without the variation in conductivity of the electrodes being high. The invention uses a device provided with active layers in which the impedance variation is small or zero. In particular, the first active layer and/or the second active layer may have a small variation in electrical conductivity following emission of a current pulse from the generating means.

According to one possibility, the device may also comprise at least one metallic collector layer in contact with the first active layer and at least one other metallic collector layer in contact with the second active layer.

The material used in the "active" layers is a material chosen such that a small variation in concentration of charged species in active layers will cause a large variation in its electrochemical potential, around a given particular material composition. Thus, according to the invention and unlike prior art, the potential variation is generated although the electrical conductivity between the layers varies very little.

The first active layer and/or the second active layer may be based on an intercalation compound comprising at least one transition metal oxide.

According to one possibility, the first active layer and the second active layer may be identical.

The first active layer and the second active layer may be based on $LiMn_2O_4$, which advantageously has a large electrochemical potential variation for a small variation in the $Li^+$ charged species within the material around the $LiMn_2O_4$ composition.

The invention also relates to a memory device like that described above.

The memory device according to the invention has improved consumption and operates at low voltages. The write and erase processes of the memory device according to the invention take place quickly, reversibly, reproducibly, and are reliable in time.

The invention relates to at least one process for control of a memory device containing a stack of layers comprising:
at least one first active layer based on a crystalline ionic and electronic conducting material capable of releasing and/or accepting at least one ionic species;
at least one second active layer based on a crystalline ionic and electronic conducting material capable of releasing and/or accepting said ionic species;
at least one layer forming an electrolyte between the first active layer and the second active layer, and based on at least one ionic conducting and electronic insulating material, the process comprising at least one step to measure the electrochemical potential difference between said first active layer and said second active layer.

According to one possible embodiment, the process may comprise at least one step to inject at least one current pulse into said stack.

The first active layer and the second active layer including a material likely to present a strong variation of potential, for a small variation in concentration of the aforesaid the ionic species, a device according to the invention does not require electrodes with important thickness, so that the electrodes of the memory can have a thickness lower than 1 µm.

BRIEF DESCRIPTION OF THE DRAWINGS

This invention will be better understood after reading the description of example embodiments given purely for information and in no way limitative, with reference to the appended drawings on which.

The different parts shown in the figures are not necessarily shown at the same scale, to make the figures more easily readable.

DETAILED PRESENTATION OF PARTICULAR EMBODIMENTS

Figure 1:
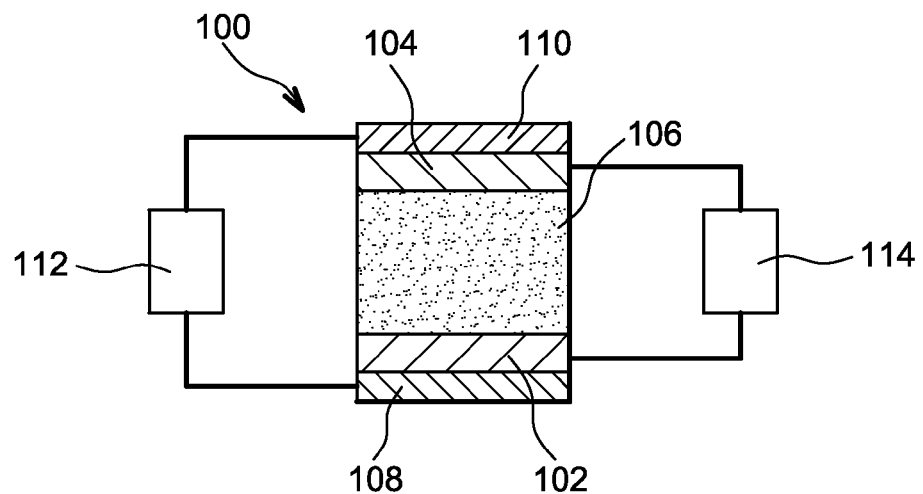
FIG. 1 illustrates a memory device according to the invention.

FIG. 1 shows an example of an electrochemical memory cell device according to the invention. This device 100 comprises a stack of thin layers comprising a first layer 102 called the "active" layer based on an ionic and electronic conducting crystalline material capable of containing at least one ionic species and also releasing and/or accepting this ionic species. The first active layer 102 may be based on at least one intercalation compound comprising a transition metal oxide. The intercalation compound may be a lithiated transition metal oxide, for example a lithiated manganese oxide $Li_xMn_yO_z$ (where x, y, z are integer numbers) such as $LiMn_2O_4$, with a stoichiometric spinel structure. The thickness of the first layer 102 may for example be between 10 nanometers and 200 nanometers, or at least less than 1000 nm.

The stack of thin layers also comprises a second layer 104 called the "active" layer based on a crystalline ionic and electronic conducting material capable of containing at least one ionic species and also capable of releasing and/or accepting this ionic species. The second active layer 104 may be based on at least one intercalation compound comprising a transition metal oxide such as a lithiated transition metal oxide, for example a lithiated manganese oxide $Li_xMn_yO_z$ such as $LiMn_2O_4$, with a stoichiometric spinel structure. The thickness of the second active layer 104 may for example be between 10 nanometers and 200 nanometers or at least less than 1000 nm. According to one possible embodiment, the active layers 102 and 104 may be identical.

A layer or a stack of layers forming an electrolyte 106 separates the first active layer 102 from the second active layer 104. The electrolyte 106 may for example be formed from an ionic conducting and electronic insulating material, for example a "Lipon®" type glass with composition $1B_2O_3$-$0.8Li_2O$-$0.8Li_2SO_4$. The thickness of the electrolyte 106 is chosen so that it is resistant to the passage of electrons, but is sufficiently weak so that it does not create any excessive resistance to the passage of ions. The thickness of the electrolyte layer 106 may for example be between 10 nanometers and 200 nanometers, and may for example be of the order of 100 nanometers. Two current collector layers 108, 110 may be associated with each active layer 102, 104.

The device also comprises current generating means 112 capable of issuing current pulses to the first active layer 102 and/or to the second active layer 104, to enable an exchange of ionic species between the active layers 102 and 104, and a changeover of the memory cell from one given state to another given state. Means may be provided to measure the total current quantity (for example in µAh) output by or to the device 100.

The memory cell may be in at least two distinct states, including the so-called "ON" state for which the first active layer 102 and the second active layer 104 have given compositions of ionic species, and another "OFF" state for which the compositions of ionic species in the first active layer 102 and the second active layer 104 are different from said given compositions. For example, in the case in which the active layers 102, 104 are based on a lithiated transition metal oxide, a variation in the concentration of lithium ions of the order of 10% in the active layers 102 and 104 can cause the memory cell to changeover from a first "ON" or "OFF" state to a second "OFF" or "ON" state.

The current pulses output by the current generating means 112 may be low current pulses, for example between $10^{-9}$ A and $10^{-6}$ A, for example for a duration of between 1 ns and 1 s. A current pulse of the order of $10^{-7}$ A for a duration of the order of one second may be output for example to make the memory cell change over from an "ON" state to an "OFF" state or vice versa.

The current generating means 112 may be designed to output a current pulse with a given intensity to the first active layer 102 to change the cell from a first "ON" or "OFF" state to a second "OFF" or "ON" state, and also an opposite current pulse to the second active layer 104, with the same intensity as the given intensity to make the memory cell change from the second "OFF" or "ON" state to the first "ON" or "OFF" state. Alternately, the system could be short circuited to make it change over from the "ON" state to the "OFF" state: since the two electrodes have different compositions with a strong potential between them, the compositions will automatically come into equilibrium by outputting a current into the external circuit to return to the original $LiMn_2O_4$/electrolyte/$LiMn_2O_4$ state in the case illustrated, and the potential at the terminals in this system is zero.

The device also comprises measurement means 114 connected to the first active layer 102 and to the second active layer 104 capable of measuring an electrochemical potential difference between said first active layer 102 and said second active layer 104. This electrochemical potential difference may be determined by measuring the potential difference between the active layers 102 and 104. The measurement means 114 may determine the state of the memory cell.

More generally, the current pulses output by the generating means 112 are designed to have sufficient intensity to make the memory cell change over from a first "OFF" state to a second "ON" state and possibly from an "ON" state to an "OFF" state. The "ON" state of the memory is a state associated with a first value of the electrochemical potential difference between the first active layer 102 and the second active layer 104, or a first range of electrochemical potential difference values between the first active layer 102 and the second active layer 104. The "OFF" state of the memory is a state associated with a second value of the electrochemical potential difference between the first active layer 102 and the second active layer 104 or with a second range of values of electrochemical potential differences between the first active layer 102 and the second active layer 104. Said second value is different from the first value or said values of the said second range are different from the values of said first range.

According to one possibility, the "OFF" state may be associated with a zero value of the electrochemical potential difference between the two active layers 102 and 104. An "OFF" state may be represented by a zero value of the electrochemical potential difference between identical active layers 102 and 104.

The first active layer 102 and the second active layer 104 are based on an intercalation material chosen such that under the effect of a small variation in composition or concentration in charged species similar to a given composition of the material, this material has a large variation in the electrochemical potential. For example, a layer based on $LiMn_2O_4$ has a large variation of electrochemical potential under the effect of a small variation in the composition or concentration of $Li^+$ ions. The corresponding intercalation material used in the active layer 102 and the active layer 104 is chosen such that this material has a potential variation at least equal to or greater than 0.3 volts or equal to or greater than 0.5 volts under the effect of a variation of less than 10% or less than 5% in the concentration of charged species; in particular, for electrodes initially composed of $LiMn_2O_4$, it is possible to obtain 0.4 V, for example. The fact that the lithium intercalation and deintercalation process in materials such as $LiMn_2O_4$ in the immediate vicinity of this composition is known to be reversible improves the reliability of this memory cell concerning retention of information and improved cyclability.

The stack of layers 100 may also include a layer 108 called the "collector" layer in contact with the first active layer 102. The so-called "collector" layer 108 is based on an electricity conducting material that may be a metallic material, for example such as Ni. Another "collector" layer 110 in contact with the second active layer 104 may be provided; the other "collector" layer 110 may be based on an electricity conducting material that may be a metallic material, for example such as the Ni. The collector layers 108 and 110 may be connected to the current generating means 112 and/or to the measurement means 114 that can then measure an electrochemical potential difference between these collector layers 108, 110; these layers 108, 110 may be for example between 10 nm and 100 nm thick. The collector layer 108 and the first active layer 102 form a first electrode, while the collector layer 110 and the second active layer 104 form a second electrode.

An example of the operation of the memory cell provided with active layers 102 and 104 based on $LiMn_2O_4$ will now be given with reference to the curve in FIG. 2, on which the abscissa shows the $Li/Mn_2O_4$ atomic ratio, while the ordinate gives the measured potential between an active layer and a metallic lithium reference electrode. In the initial state (point reference 200 on the curve), the two active layers 102 and 104 have a similar composition and the potential difference between the two active layers 102 and 104 is zero. This first state may be considered to be an "OFF" state of the memory.

When a first current pulse is imposed by the generating means 112 to the collector layer 108 in contact with the first active layer 102, a small quantity of $Li^+$ charged species can be exchanged between the two active layers 102, 104.

Following emission of said first current pulse, the electrochemical reaction in the second active layer 104 may be as follows:

$$LiMn_2O_4 + \epsilon Li^+ => Li_1 + \epsilon Mn_2O_4 \tag{1}$$

The following electrochemical reaction may take place at the first active layer 102:

$$LiMn_2O_4 - \epsilon Li^+ => Li_1 - \epsilon Mn_2O_4 \tag{2}$$

After emission of the first pulse, the potential of the first active layer 102 (portion of curve 204) formed from a compound $Li_{1+\epsilon Mn2}O_4$ is similar to 2.85 Volts, while the potential of the second layer 104 formed from a compound $Li_{1-\epsilon}Mn_2O_4$ increases (portion, of curve 202) corresponding to the deintercalation of lithium. It is found that a small variation in the concentration of ionic species in the layers 102, 104, induced by an exchange of charged species between these layers, causes a large variation in potential between the two active layers 102, 104. The rate at which the potential increases is fast and depends on the diffusion rate of charged species within the system formed by the electrolyte and the active layers. The memory changes to an "ON" state. When the current pulse is no longer imposed, the flow of charged species immediately stops within the electrolyte 106 and the active layers 102, 104 remain in their existing state. The potential measurement means 114 at the terminals of this system provide an indication of the "ON" state of the memory. This memory state is maintained due to the electrolyte 106 which, as a result o the material from which it is composed and its thickness, prevents spontaneous diffusion of $Li^+$ ions in the absence of current pulses.

This memory may be erased by imposing a second equal current pulse opposite to the first previously imposed current pulse, or by short circuiting the system. (Opposed means that the second current pulse has an intensity equal to the intensity of the first current pulse emitted to the second active layer 104.)

The system is then in the initial "OFF" state once again, with two identical active layers 102 and 104 on each side of the electrolyte 106.

Figure 2:
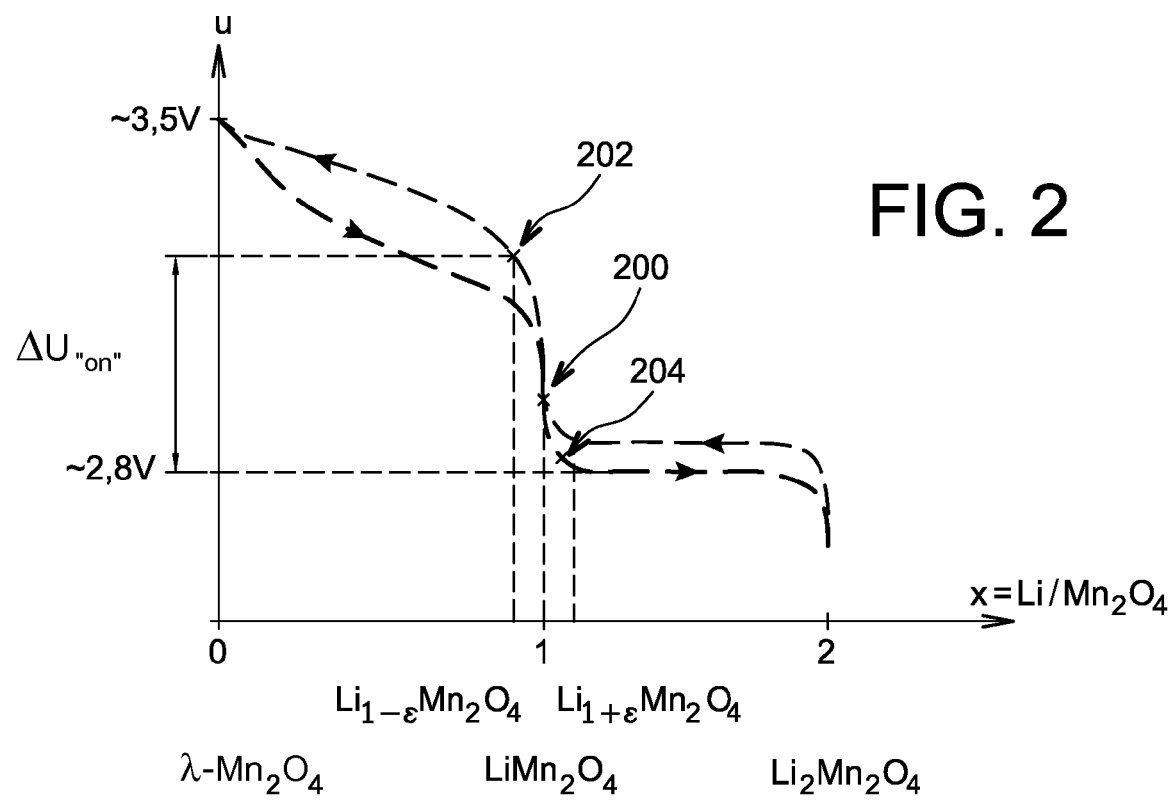
FIG. 2 illustrates a potential electrode curve for a "metallic lithium/electrolyte/electrode containing $LiMn_2O_4$" system, that helps to understand operation of a memory device according to the invention as a function of the concentration of charged species in the electrodes.

FIG. 2 shows two curves, each giving the variation in voltage at the terminals of the metallic lithium (negative electrode)/electrolyte/active (positive) electrode system as a function of the quantity of lithium contained in the active positive electrode material. Consequently, this system is a lithium accumulator that can be "discharged" when a resistance is placed at these terminals (the system them spontaneously outputs a current and the voltage at its terminals decreases gradually), or "recharged" when an electric current is input into it by means of an external generator (the voltage at the system terminals then increases gradually). The first curve between 3.5 V and 2.5 V corresponds to intercalation of lithium into the $\lambda$-$Mn_2O_4$ structure to form $Li_2Mn_2O_4$ (accumulator "discharge"); conversely, the second curve between 2.5 V and 3.5 V corresponds to deintercalation of lithium in the $Li_2Mn_2O_4$ structure to once again form the initial $\lambda$-$Mn_2O_4$ compound accumulator ("charge") The hysteresis observed between the two curves, which depends on the intensity of the current passing through the system (the charge or discharge "rate"), corresponds to overvoltages at the electrodes and to the internal resistance of the system. For a given charge or discharge current, a small potential difference, typically approximately 100 to 200 mV, between the two curves results in a small internal resistance of the system throughout the lithium intercalation and deintercalation process in the crystalline structure of the intercalation compounds contained in the active electrode. This small internal resistance of the system represents the ease with which lithium ions can be intercalated or deintercalated in the crystalline structure of the active material.

An example of a process for manufacturing the memory device described above will now be given. The first step is to make the first layer 102 of the first active electrode. The active material in this first layer 102 may be $LiMn_2O_4$ formed from a powder with a controlled size grading, with dimensions of the order of one micron or about ten microns. This powder may then be sintered and used as a target in a PVD ("Physical Vapour Deposition") system. The first layer 102 may be deposited on an electronic conducting layer 108 that may be based on a metallic material, for example such as nickel. The electronic conducting layer 108 will form the current collector in the first electrode. According to one variant, the first layer 102 can be formed using processes usually used to produce lithium accumulator electrodes (*Journal of Power Sources*, 1993, 44(1-3): 689-700). An electrolyte layer 106 is then formed on the first active layer 102. The electrolyte layer may be produced by physical vapour deposition of an ionic conducting and electronic insulating material, for example a "Lipon®" type glass or glass with composition $1B_2O_3$-$0.8Li_2O$-$0.8Li_2SO_4$.

The second active layer 104 of the second electrode is then deposited on the electrolyte layer 106, for example using the same deposition process as for the first active layer 102 of the first electrode. The next step is to deposit an electronic conducting layer 110, for example by a physical or vapour phase type deposition, for example based on nickel, designed to form a second current collector for the second electrode.

The next step is to encapsulate the assembly so as to protect the device. The encapsulation type may be chosen from among the many devices used in microelectronics, for example encasing in a resin, or any other device to prevent the risk of the system being contaminated by the environment (dust, etc.). Note that the device according to the invention does not need to be airtight because the active electrode materials are stable under oxygen.

The materials used to implement a memory device according to the invention like that described above are not toxic, do not require any particular manipulation precautions, are inexpensive and may be manipulated in the ambient atmosphere; they are adapted to thin layer production techniques used in microelectronics.

The electrochemical memory device according to the invention has low consumption, high sensitivity and high speed, and good stability of electrodes with time. A memory cell according to the invention has good reversibility, and the change from an "ON" state to an "OFF" state and from an "OFF" state to an "ON" state may be provoked by a first current pulse and a second current pulse opposite to the first pulse respectively, or by short circuiting the system.

A measurement system according to the invention is more sensitive than a system based on the variations of electrical conductivity of the electrode, this measurement being an average measurement, less accurate than that implemented in the present invention.

A system of measurement according to the invention does not require electrodes with important thickness, so that the electrodes of the microelectronic device can have a thickness lower than 1 μm.

The device according to the invention is not limited either to electrodes containing $LiMn_2O_4$ and can be implemented using other crystalline and ionic and electronic conducting materials, able to release and/or accept at least one ionic species and likely to present an important variation of electrochemical potential under the effect of a weak variation of their respective compositions.

Various examples of compound or mixtures of compounds, likely to present a variation of potential higher or equal to 0.3 volts or 0.5 volts for a variation in concentration of the ionic species lower than 5% or 10%, can be used. The choice of such materials can be made function of their potential of insertion/extraction of lithium. The potential of insertion/extraction of lithium in the compounds containing metals of transition depends in particular on Mn+1+/Mn+ couples of the metal considered, of the component anions their close environment (oxygen, sulphur, selenium or polyanions containing Si, P, S, Ge, As).

The electrodes can be made according to other examples:
Based on a compound of the spinel type such as $LiNi_{0.5}Mn_{1.5}O_4$ presenting two processes of intercalation/extraction quite distinct in potential: $\square Mn_2O_4$ ($\lambda$-$MnO_2$)$\Leftrightarrow LiMn_2O_4 \Leftrightarrow Li_2Mn_2O_4$
Based on a compound of the olivine type such as $LiMPO_4$, $LiMSiO_4$, or $Li_xFe_{1-x}Mn_xPO_4$ presenting two processes of intercalation/extraction quite distinct in potential:
$\square Fe_{1-x}Mn_xPO_4 \quad \Leftrightarrow Li_xFe_{1-x}Mn_xPO_4 \Leftrightarrow LiFe_{1-x}Mn_xPO_4$
(0<x<1)
step 1: 4.1V/$Li^+$/Li ; step 2: 3.45V/$Li^+$/Li □Fe$_{1-x}$CO$_x$PO$_4$⇔Li$_x$Fe$_{1-x}$CO$_x$PO$_4$⇔LiFe$_{1-x}$CO$_x$PO$_4$ (0<x<1).

The choice of such material can be carried out using ab initio evaluation potentials of intercalation by the calculation of free energy of Gibbs by methods applying the theory of the functional calculus of density (DFT) with various alternatives.

The electrodes can include a mixture of two compounds which have different respective values of potential of intercalation/extraction of lithium and which initially includes a compound in his reduced form and the other in his oxidized form.

According to a variant, the electrodes can comprise lithium compounds having a two-phase intercalating/extraction process. Such compounds make it possible to have a more important rupture of the profile of potential, and a clearer distinction on both sides of the initial composition, in order to obtain a better distinction between the states of the memory.

Examples of such compounds, likely to be used as electrode material, are given below:

α.□FePO$_4$+1−α.LiTiCrO$_4$⇔α.LiFePO$_4$+1−α.LiTiCrO$_4$⇔α.LiFePO$_4$+1−α.Li$_2$TiCrO$_4$

α.□FePO$_4$+1−α.Li$_{4/3}$Ti$_{5/3}$O$_4$
⇔α.LiFePO$_4$+1−α.Li$_{4/3}$Ti$_{5/3}$O$_4$⇔α.LiFePO$_4$+1−α.Li$_{7/3}$Ti$_{5/3}$O$_4$

α.□VPO$_4$F+1−α.Li$_{4/3}$Ti$_{5/3}$O$_4$
⇔α.LiVPO$_4$F+1−α.Li$_{4/3}$Ti$_{5/3}$O$_4$⇔α.LiVPO$_4$F+1−α.Li$_{7/3}$Ti$_{5/3}$O$_4$

α.□VPO$_4$F+1−α.Fe$_2$(MoO$_4$)$_3$
⇔α.LiVPO$_4$F+1−α.Fe$_2$(MoO$_4$)$_3$⇔α.LiVPO$_4$F+1−α.Li$_2$Fe$_2$(MoO$_4$)$_3$

α.□Ni$_{0.5}$Mn$_{1.5}$O$_4$+1−α.εVOPO$_4$
⇔α.LiNi$_{0.5}$Mn$_{1.5}$O$_4$+1−α.εVOPO$_4$
⇔α.LiNi$_{0.5}$Mn$_{1.5}$O$_4$+1−α.LiVOPO$_4$

The invention claimed is:

1. Memory device comprising a stack of layers including:
at least one first active layer based on a crystalline ionic and electronic conducting material capable of releasing and accepting at least one ionic species;
at least one second active layer based on a crystalline ionic and electronic conducting material capable of releasing and accepting said ionic species;
the first active layer and the second active layer being based on a material that is capable of a potential variation higher than or equal to 0.3 volts or 0.5 volts for a variation in the concentration of said ionic species of less than 5% or 10%;
at least one layer forming an electrolyte between the first active layer and the second active layer, and based on at least one ionic conducting and electronic insulating material; and
a measurement device for measuring the electrochemical potential difference between said first active layer and said second active layer.

2. Memory device according to claim 1, comprising a generating device capable of injecting current into said stack in the form of current pulses.

3. Memory device according to claim 1, also comprising at least one metallic layer in contact with the first active layer and/or at least one other metallic layer in contact with the second active layer.

4. Memory device according to claim 1, the first active layer and the second active layer being based on an intercalation compound comprising at least one transition metal oxide.

5. Memory device according to claim 1, the first active layer and the second active layer being identical.

6. Memory device according to claim 1, the first active layer and the second active layer being based on LiMn$_2$O$_4$.

7. Memory device comprising a stack of layers including:
at least one first active layer based on a crystalline ionic and electronic conducting material capable of releasing and/or accepting at least one ionic species;
at least one second active layer based on a crystalline ionic and electronic conducting material capable of releasing and/or accepting said ionic species;
the first active layer and the second active layer being based on LiMn$_2$O$_4$;
at least one layer forming an electrolyte between the first active layer and the second active layer, and based on at least one ionic conducting and electronic insulating material; and
a measurement device for measuring the electrochemical potential difference between said first active layer and said second active layer.

8. Memory device according to claim 7, comprising a generating device capable of injecting current into said stack in the form of current pulses.

9. Memory device according to claim 7, also comprising at least one metallic layer in contact with the first active layer and/or at least one other metallic layer in contact with the second active layer.

10. Memory device comprising a stack of layers including:
at least one first active layer based on a crystalline ionic and electronic conducting material capable of releasing and accepting at least one ionic species;
at least one second active layer based on a crystalline ionic and electronic conducting material capable of releasing and accepting said ionic species;
the first active layer and the second active layer being based on intercalation compound comprising at least one transition metal oxide;
at least one layer forming an electrolyte between the first active layer and the second active layer, and based on at least one ionic conducting and electronic insulating material; and
a measurement device for measuring the electrochemical potential difference between said first active layer and said second active layer.

11. Memory device according to claim 10, comprising a generator device capable of injecting current into said stack in the form of current pulses.

12. Memory device according to claim 10, also comprising at least one metallic layer in contact with the first active layer and/or at least one other metallic layer in contact with the second active layer.

* * * * *